United States Patent [19]

Zaderej et al.

[11] Patent Number: 5,397,239
[45] Date of Patent: Mar. 14, 1995

[54] MOLDED HINGED CONNECTOR

[75] Inventors: Victor Zaderej, Branford, Conn.; Michael P. Coletta, Livonia, Mich.; Howard Kell, Farmington Hills, Mich.; Daniel F. Sheldon, Dearborn, Mich.

[73] Assignees: Circuit-Wise, Inc., North Haven, Conn.; Ford Motor Company, Dearborn, Mich.

[21] Appl. No.: 168,944

[22] Filed: Dec. 17, 1993

[51] Int. Cl.⁶ .............................................. H05K 3/32
[52] U.S. Cl. ...................... 439/55; 174/254; 174/261; 439/78
[58] Field of Search ............. 439/55, 78, 77; 361/761; 174/254, 261

[56] References Cited

U.S. PATENT DOCUMENTS

| | | | |
|---|---|---|---|
| 3,365,694 | 1/1968 | Parker | 439/77 |
| 3,417,362 | 12/1968 | Reynolds | 439/77 |
| 4,121,044 | 10/1978 | Hadersbeck et al. | 174/254 |

OTHER PUBLICATIONS

What ever happened to Molded 3D Circuit Boards? by Carl Kirkland–Plastics World/Feb. 1993.
A. Schulman Inc.–Literature Polypropylene living Hinge Design and Manufacture.
SAE Technical Paper Series, Congress and Exposition Coba Hall Detroit.

*Primary Examiner*—Kenneth J. Ramsey
*Attorney, Agent, or Firm*—Herbert R. Ruschmann; Mark A. Catan; Thomas R. Morrison

[57] ABSTRACT

A molded circuit board has an aperture wherein a contact member is flexibly carried by a living hinge. Conductor traces are plated upon the contact member, the living hinge, and the circuit board. The conductor traces form contacts on the contact member which are electrically connected to the conductor traces on the circuit board. A mating connector, having resilient contacts, is inserted into the aperture, folding back the contact member. The resilient contacts engage the contacts on the contact member. Another embodiment includes dual contact members hinged on opposing sides of an aperture. A further embodiment has a contact member which is folded up and inserted into a mating connector. In the above embodiments the contact members are molded with thin breakable portions of material holding the contact members in planes of the circuit boards. The present invention is formed from a polymeric material including one of polypropylene, polyethylene, and nylon. The polymeric material includes fillers including at least one of calcium carbonate, glass, and talc for heat stability. The polymeric material is pretreated in an organic solvent, such as turpentine, before etching during the plating process.

31 Claims, 4 Drawing Sheets

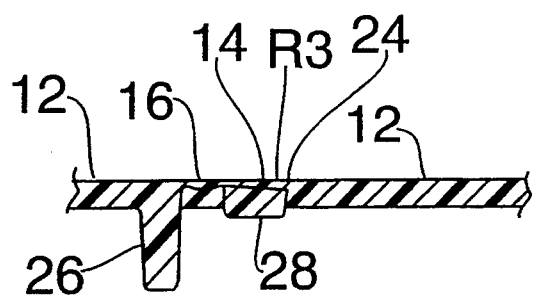
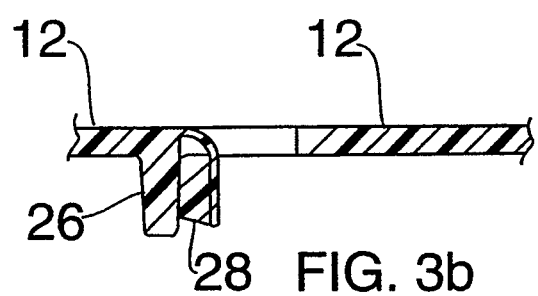
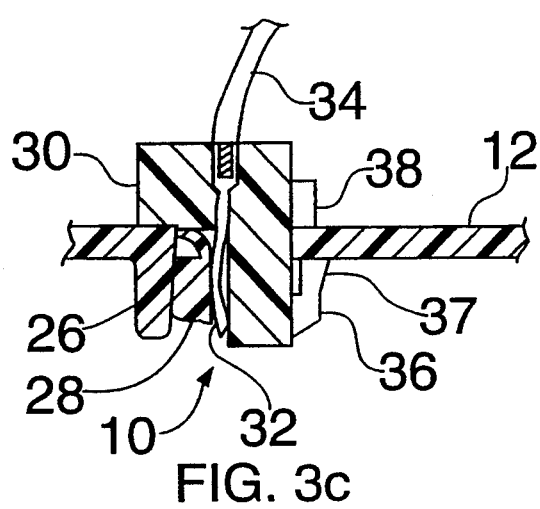
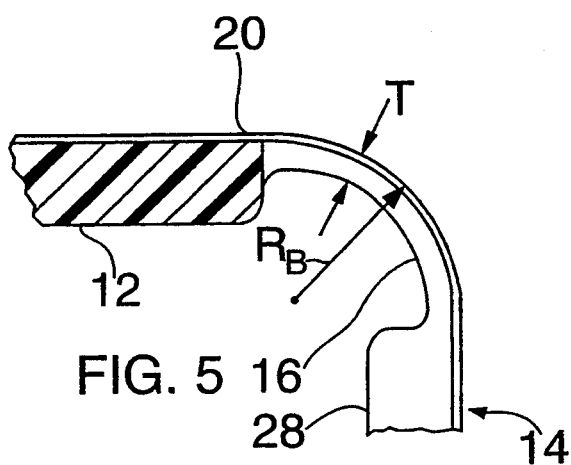
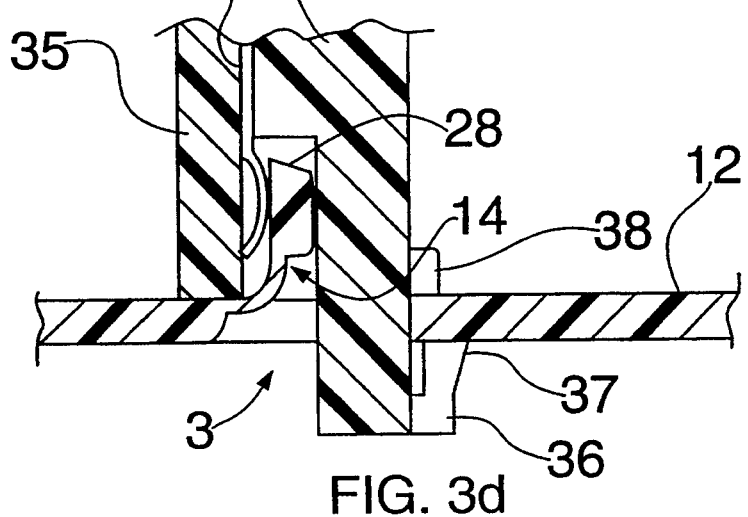

MOLDED HINGED CONNECTOR

BACKGROUND OF THE INVENTION

The present invention relates to interconnect devices for providing electrical connections to printed circuit boards, and more particularly, to a molded connector having a plated living hinge which is formed integrally with a circuit board.

Efforts to reduce costs associated with electrical systems and packaging include those directed towards integrating components so that part counts and costs are reduced while increasing reliability. In particular, interests exist in the area of integrating connectors into printed circuit boards so that both are produced during the same plating and etching process. One such connector utilizes flexible printed circuits ("flex circuits") or "flex-film" circuits which are comprised of polyimide or polyester film having conductors printed upon a surface thereof. The flex circuit is then connected to a rigid circuit board by solder or by laminating the flex circuit upon the rigid circuit board. The flex circuit forms the conductive circuitry of the rigid circuit board and extends off the rigid circuit board to provide a flexible electrical connection to another object. The connector takes the form of a socket wherein flex circuit is laminated upon a circuit board having a rectangular aperture for accepting a male connector. The flex circuit has exposed conductors and extends into an area of the aperture. When the male connector is inserted, the flex circuit deflects into the aperture and contacts on the male connector make contact with the exposed conductors on the flex circuit. While flex circuits provide effective flexible electrical connections, their use necessitates the lamination of the flex circuit upon the rigid circuit board. The cost of production, both in terms of labor costs and the costs of providing and maintaining an increased number of parts, is increased over that of a normal printed circuit board.

Another method of providing a connector in a molded circuit board employs three dimensional plated circuits as disclosed in U.S. Pat. No. 4,985,116, "Three Dimensional Plating Or Etching Process And Masks Therefor", issued to Mettler et al. A rectangular recess is provided in a molded circuit board. Conductors are then plated on inside surfaces of the recess. A plug, inserted into the recess, has resilient contacts which make electrical contact with the conductors. This type of molded connector is useful in applications requiring the three dimensional plating. However, many applications do not require three dimensional plating. Three dimensional plating is more expensive than standard two dimensional plating and etching techniques used on flat circuit boards. Therefore, the use of such a connector is not necessarily advantageous where other plated three dimensional features are not required and two dimensional plating is otherwise sufficient.

Printed wiring boards are often used as backplanes for display and control panels. Specific applications, for example, include consumer electronics and automobile dashboards. The use of printed circuit boards as a backplane allows for the elimination of wire harnesses interconnecting manual controls and annunciators. Such circuit boards are molded in required configurations and incorporate either the flex circuit connector, the three dimensional connector, or a connector shell and pins affixed after molding or during molding. While use of the rigid printed boards as dashboard backplanes provides for significant cost savings in both assembly and parts count, competition dictates that further cost savings be continuously sought. Therefore, a requirement exists for an interconnection means which does not require flex circuit, three dimensional etching, or the incorporation of a separate connector shell, and which is less expensive than present methods.

Flex circuits permit bendable contacts to be formed and used in integral connectors. Typically, flex circuits are fabricated upon flexible polyester and polyimide films to which components may be soldered. A copper foil coated with an adhesive is laminated upon the flexible films. The required conductor patterns are then etched in the copper foil. Although flex circuit circuitry provides a practical solution in applications requiring a flexible circuit, a flex circuit cannot by itself provide rigidity in applications requiring positive support for components connected to the flex circuitry. Furthermore, while the polyester and polyimide materials are well suited for the formation of flexible films, neither can be used for injection molding. Therefore, where rigidity is required in a circuit board having molded features, such as a instrument cluster backplane, the flex circuit must be connected to or laminated upon a rigid substrate composed of a moldable material such as polypropylene.

Other substrate materials are also used with flex circuits. Such materials include polyetherimide, also known as "ULTEM" produced by the General Electric Corporation, polysulfone, ABS, and polycarbonate. These materials are typically used in circuit boards but are unsuitable for applications requiring flexibility because the material fracture if flexed.

There also exists a flexible circuit board material produced under the name "BEND FLEX" by the Roger's Corporation. This material is a copper laminate material which possesses a constant flexural modulus throughout. The material requires a relatively large bending radius compared to flex circuitry and does not possess sufficient rigidity for the mechanical support of fixed components required in most applications involving control and display backplanes.

Flexible plastic hinges, known in the trade as "living hinges", have been used in articles of manufacture requiring a hinged member where production of the entire article in a single molding step is desired. Plastics suitable for the formation of living hinges must endure stretching ratios as high as 2 or 3 to 1. Therefore, such plastics must possess the capability of high elongation beyond their yield point and a low modulus of elasticity. Acceptable plastics include polypropylene, polyethylene, and nylon. However, such characteristics, combined with low dimensional stability at elevated temperatures, are unacceptable for materials used in the production of circuit boards wherein rigidity and high-temperature stability are required.

OBJECTS AND SUMMARY OF THE INVENTION

Accordingly, it is an object of the invention to provide a connecting device which overcomes the drawbacks of the prior art.

Another object of the invention to provide an integrally molded flexible interconnect device for providing electrical connections to circuit boards without the need of added connectors or laminated flex circuits.

A further object of the present invention is to provide a circuit board with a molded connector having three dimensional features which is fabricated using two dimensional imaging techniques which may be screened or photo-imaged.

A still further object of the present invention is to provide a connector which is integrally formed in a circuit board and has a living hinge capable of having conductors plated thereon and withstanding circuit board assembly techniques.

Finally, it is an object of the present invention to provide a connector in a circuit board formed of a polymeric material having a composition providing for both heat stability and flexibility.

Briefly stated, the present invention provides a molded hinged connector which is fabricated integrally with a circuit board by injection molding. The molded circuit board has an aperture wherein a contact member is flexibly carried by a living hinge. Conductor traces are plated upon the contact member, the living hinge, and the circuit board. The conductor traces form contacts on the contact member which are electrically connected to the conductor traces on the circuit board. A mating connector, having resilient contacts, is inserted into the aperture, folding back the contact member. The resilient contacts engage the contacts on the contact member. Another embodiment includes dual contact members hinged on opposing sides of an aperture. A further embodiment has a contact member which is folded up and inserted into a mating connector. In the above embodiments the contact members are molded with thin breakable portions of material holding the contact members in planes of the circuit boards. The present invention is formed from a polymeric material including one of polypropylene, polyethylene, and nylon. The polymeric material includes fillers including at least one of calcium carbonate, glass, and talc for heat stability. The polymeric material is pretreated in an organic solvent, such as turpentine, before etching during the plating process.

In accordance with these and other objects of the invention, there is provided a molded electrical interconnection device for interfacing with a mating electrical connector comprising: a circuit board having an aperture; a contact member within the aperture; a living hinge connecting the circuit board and the contact member along linear edges of the aperture and the contact member; the living hinge, the circuit board and the contact member being integrally formed from a polymeric material; the contact member, the living hinge, and the circuit board having conductor traces on surfaces thereof; the conductor traces forming contacts on a surface of the contact member and electrically connecting the contacts to the conductor traces on the circuit board; and the contact member being rotatable on the living hinge so that the aperture can accept the mating electrical connector.

A feature of the present invention is the polymeric material including a flame retardant filler selected from a group consisting of glass, calcium carbonate, and talc.

A further feature of the present invention is the polymeric material being selected from a group consisting of polypropylene, polyethylene, and nylon.

Yet another feature of the present invention is the conductor traces being formed by plating and the polymeric material being treated with an organic solvent, such as turpentine, before etching during a plating process.

Still another feature of the present invention is the living hinge having a thickness, a width between the circuit board and the contact member and a bending radius limiting a strain on the conductors to 10% and less.

Finally the present invention further includes means for restricting a range of motion of the contact member to facilitate engagement with a mating electrical connector.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 3a shows a cross section of the connector of FIG. 1, taken along line IIIa—IIIa of FIG. 2a.

FIG. 3b shows a cross section of the connector of FIG. 1, taken along line IIIb—IIIb of FIG. 2b.

FIG. 3c shows a cross section of the connector of FIG. 1, taken along line IIIb—IIIb of FIG. 2b, wherein a mating connector is inserted the connector.

FIG. 3d shows a cross section of the connector of FIG. 1, taken along line IIIa—IIIa of FIG. 2a, wherein the contact member is folded up and engaged with a mating connector.

FIG. 5 shows a cross section of a living hinge of the present invention with dimensional designations.

DETAILED DESCRIPTION OF THE PREFERRED EMBODIMENT

Figure 1:
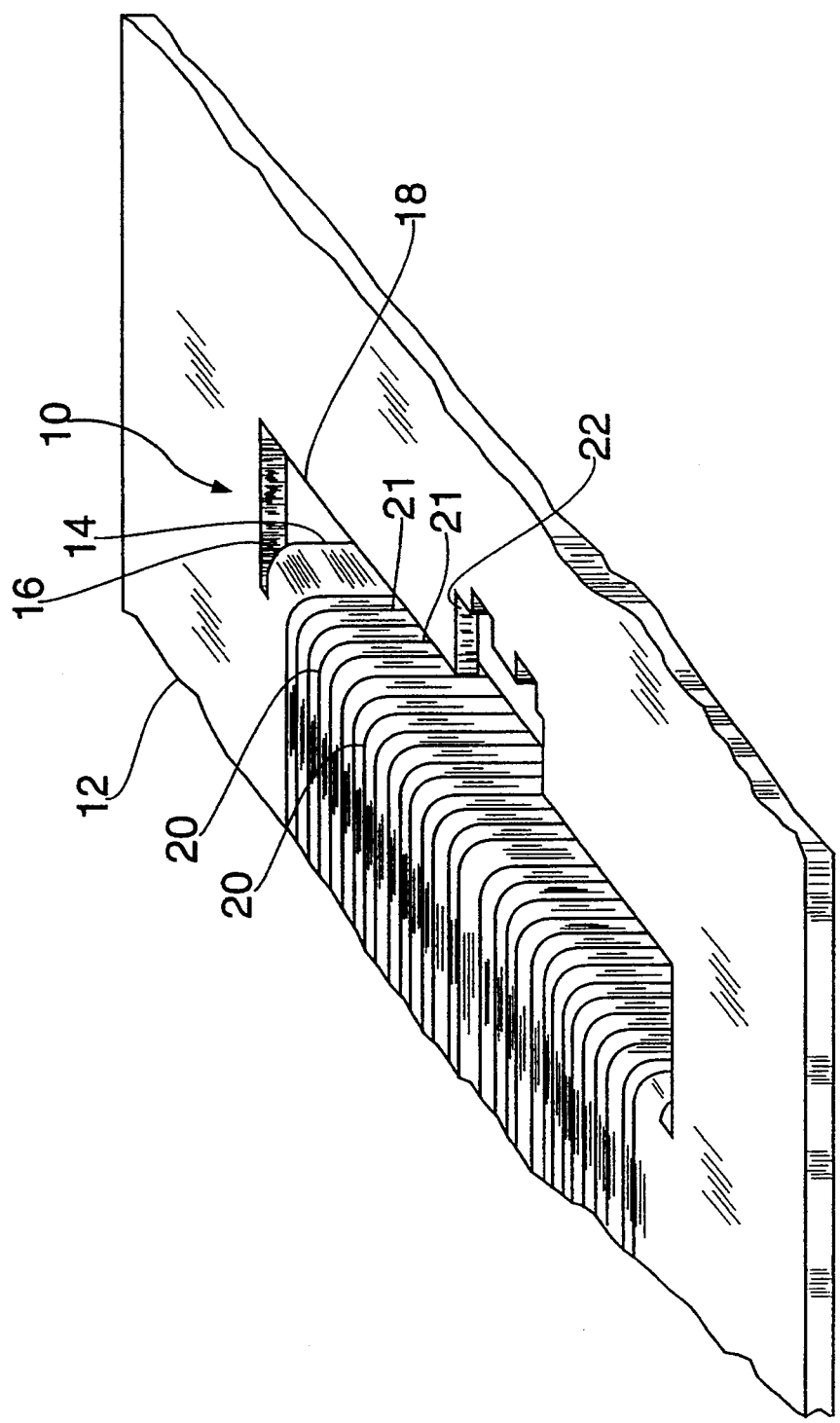
FIG. 1 shows a side perspective view of a connector of the present invention with a contact member in a down position.

Referring to FIG. 1, there is shown side perspective view of an embodiment of a connector 10 in accordance with the present invention. The connector 10 is formed integrally with a circuit board 12 by molding the connector structure into the circuit board 12. The connector 10 has a contact member 14 which is flexibly hinged to the circuit board 12 by what is known as a living hinge 16. The living hinge 16 permits contact member 14 to fold down, into an aperture 18 integrally formed in the circuit board 12. Conductors 20 are plated on the circuit board 12 and extend onto the contact member 14 forming contacts 21.

Electrical connection is made with a mating connector (not shown) which is inserted into the aperture 18. The mating connector has resilient contacts which are biased against the contacts 21 on the contact member 14, thus making the electrical connection to the circuit board 12. The aperture 18 has a notch 22 which accepts a locking clip on the mating connector for retaining the mating connector in the aperture 18.

Figure 2A:
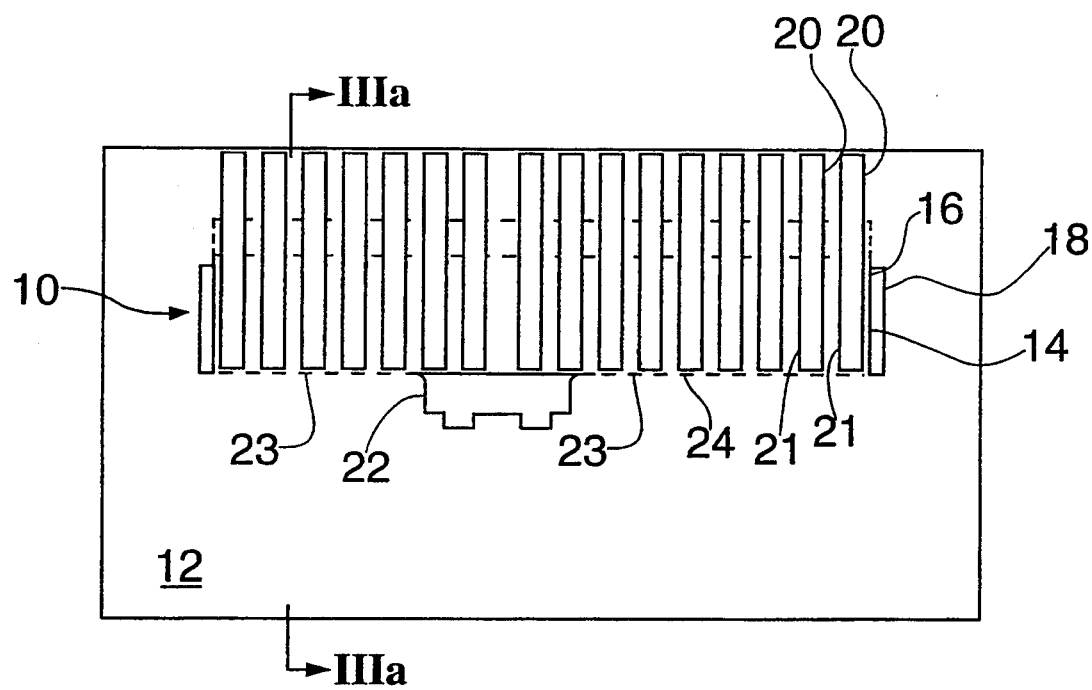
FIG. 2a shows a top view of the connector of FIG. 1 with the contact member in a straight position.
Figure 2B:
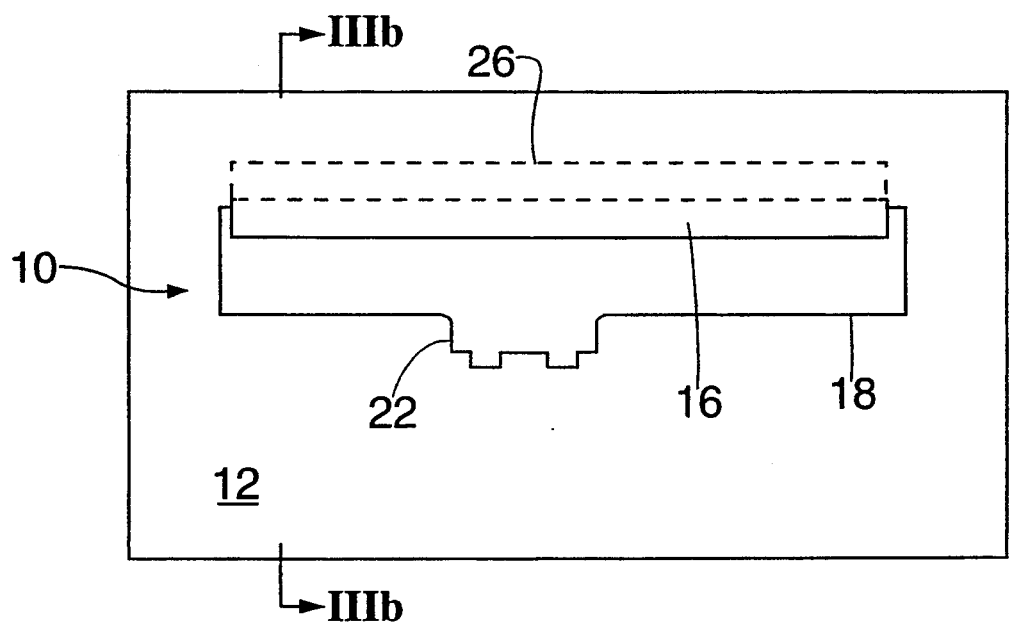
FIG. 2b shows a top view of the connector of FIG. 1 with the contact member in a down position.

Referring to FIGS. 2a and 2b, plan views of the connector 10 are shown with the contact member 14 in an straight position in FIG. 2a and in a down position in FIG. 2b. In FIG. 2a, the conductors 20 extend from the circuit board 12, across the living hinge 16, and onto the contact member 14. The living hinge 16 is formed within the aperture 18 during the process of molding the contact member 14 and circuit board 12. The contact member 14 is fabricated connected to the circuit board 12 on an edge 24 (represented by a dashed line) opposite the living hinge 16. A thin portion 23 of board material, on the order of 0.005", connects edge 24 with circuit board 12. The thin portion 23 is subsequently broken when the mating connector is inserted and the contact member 14 folds down as shown in FIG. 2b. Alternative configurations are realizable wherein the thin portion 23 is perforated, moved to short end edges of the contact member 14, or eliminated where other support means are provided during plating and etching. In FIG. 2b, the thin portion 23 has been broken and the contact member 14 is in a down position and not visible. The conductors 20 are not shown so that a location of a backstop plate 26 (shown by a dashed outline) that protrudes from a bottom of the circuit board 12 is visible. The backstop plate 26 restricts a range of movement of contact member 14 as is described further below. With the aperture 18 open as shown, the mating connector (not shown) is inserted therein and the resilient contacts of the mating connector press against contacts 21 of the contact member 14 which is restricted from moving.

Referring to FIGS. 3a and 3b, cross section views of the connector 10, taken along lines IIIa—IIIa and IIIb—IIIb of FIGS. 2a and 2b, respectively, show backstop plate 26 protruding from a lower surface of the circuit board 12. In FIG. 3a the contact member is attached temporarily to the circuit board 12 by the thin portion 23 of board material at the edge 24. The attachment facilitates two dimensional plating of the circuit board 12 by keeping a top surface of the contact member 14 in a common plane with a top surface of the circuit board 12. The contact member 14 is permanently connected to the circuit board 12 by a thin land section of the living hinge 16 which is formed during molding. The thin land section has a thickness, preferably from about 0.012" to 0.020", permitting it to flex, thus allowing the contact member 14 to be rotated with respect to the circuit board 12 until a support 28 engages the backstop plate 26.

Referring to FIG. 3c, the connector 10 is shown coupled with a mating connector 30. The mating connector 30 has a resilient contact 32 shown connected to a wire 34. The resilient contact 32 is representative of a plurality of contacts which engage the contacts 21 on the contact member 14. The resilient contact 32 presses against the contact member 14 and deflects, thereby exerting a sufficient contact pressure. A locking clip 36 is pressed through the notch 22 (shown in FIGS. 2a and 2b). The locking clip 36 and has a pawl 37 which engages a lower surface of the circuit board 12. The locking clip 36 holds the mating connector 30 in place in conjunction with a stop 38 abutting an upper surface of the circuit board 12.

Alternative embodiments of the present invention include a configuration having dual contact members which are arranged in an opposing fashion on opposite sides of an aperture in a circuit board. A mating connector is inserted between the dual contact members. In such an arrangement, locking clips are implemented on ends of the mating connector and engage notches in edges of the aperture between the dual contact members. The dual contact members are joined together along adjacent edges by a thin portion 23 of circuit board material which is broken when a mating connector is inserted into the aperture. Such alternative embodiments would be dear to one skilled in the art in view of the foregoing description and illustration and a description illustration and description are thus omitted.

Referring to FIG. 3d, another embodiment of the present invention has a contact member 14 which folds up, instead of down as in the above embodiments. The folded-up contact member 14 mates with a female type edge connector 35 which is held in place by the pawl 37 and stop 38 as discussed above. A further development of this embodiment eliminates the pawl 37 and stop 38 and instead locks onto the contact member 14, employing a locking means such as a spring member locking over a lower edge of the support 28. Such an embodiment permits a flexing connection with the circuit board to be effected.

Figure 4A:
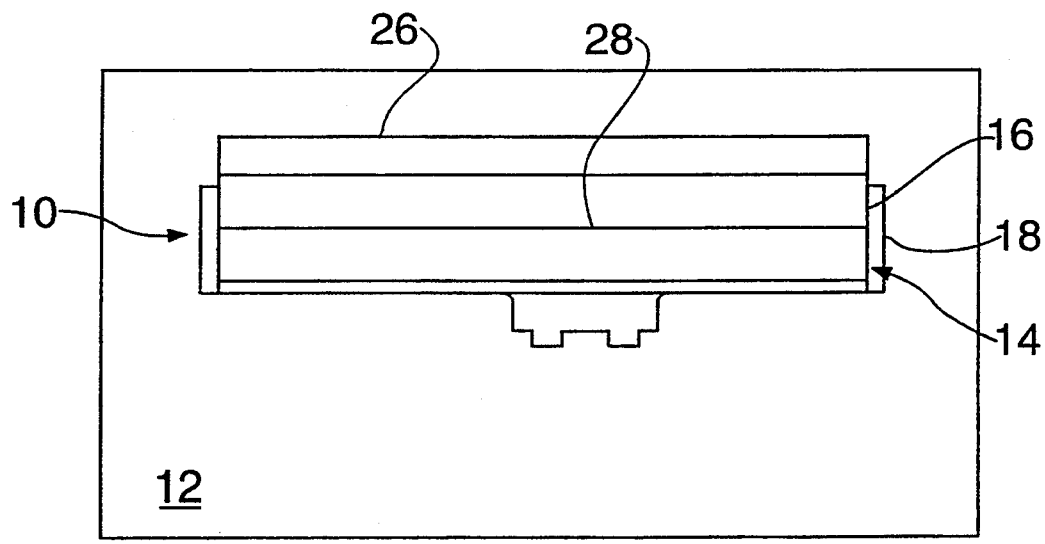
FIG. 4a shows a bottom view of the connector of FIG. 1 with the contact member in a straight position.
Figure 4B:
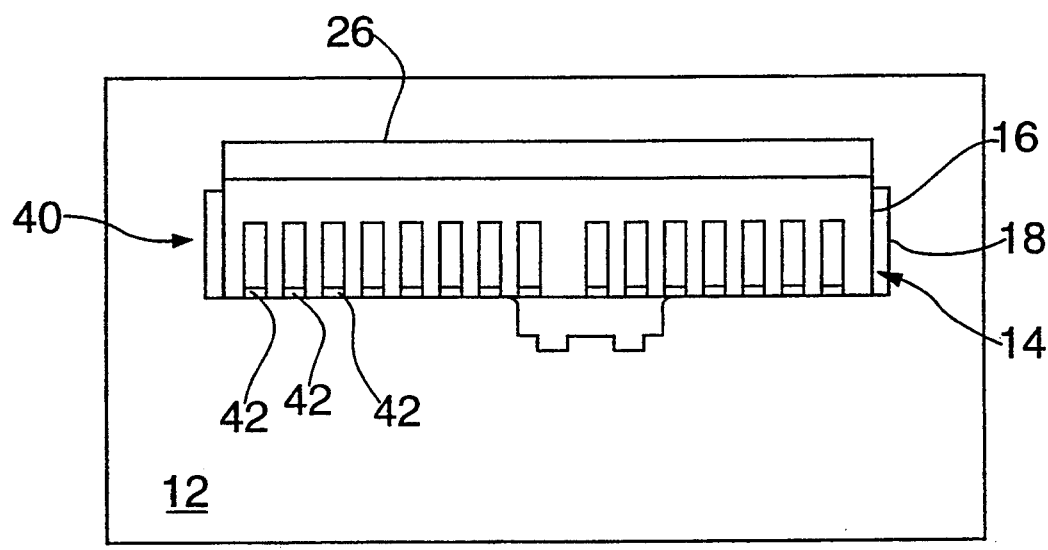
FIG. 4b shows a bottom view of the connector of FIG. 1 with the contact member in a straight position and having a segmented backplate.

Referring to FIG. 4a, a bottom view of the connector 10 shows the support 28 extending as a continuous bar over the length of a bottom of the contact member 14. The support 28 has a thickness which is sufficient to maintain the contact member 14 at a predetermined angle when the support 28 comes into contact with the backstop plate 26 as shown in FIG. 3b. Resilient contacts of a mating connector, inserted into the aperture, press against the conductors 20 (shown in FIG. 1) of the contact member 14 thereby making an electrical connection with the circuit board 12. In FIG. 4b, an alternative embodiment of the present invention is shown. Connector 40 has a series of support segments 42 which abut against backstop plate 26 when the contact member 14 is folded down. The use of segmented sections of support reduces an amount of material required for fabrication and a weight of the connector 40. Further savings and reductions may be effected by segmenting the backstop plate 26 in correspondence with the support 42. Preferably, the support Segments 42 are interspaced with the contacts 21 (shown in FIG. 2a) on the opposite side of the contact member 14, thus the support segments 42 do not lie directly beneath the contacts 21. Depressions, formed on the top surface of the contact member 14 during molding due to alternating thick and thin portions, are thereby prevented from occurring where the contacts 21 lie. It is realized that other configurations of backstops and supports may be utilized in the practice of the present invention. It is further conceivable that an alternative embodiment may eliminate the movement restricting members and instead rely upon a resiliency of the living hinge 16 to produce a sufficient contact pressure. Such alternatives are considered to be within the scope and spirit of the present invention.

The present invention provides a molded connector with a plated living hinge effecting a flexible electrical connection which is formed integrally with a molded circuit board. The above embodiments illustrate various arrangements implementing the present invention with specific configurations of apertures, contact members, locking, and stopping means. However, it is recognized that other variations of such features may be realized by those skilled in the art, in the light of this disclosure, without departing from the scope of the present invention.

Further included in the present invention is the fabrication and composition of the molded connector of the above embodiments. The circuit board 12 is fabricated by a process of injection molding polypropylene mixed with a filler material. The injection molding process permits many features to be incorporated into circuit board 12 in a single production step. Features such as standoffs, sockets, stiffening ribs, holes, ramps, and snaps are fabricated simultaneously with the living hinge 16, support 28, and backstop plate 26. This permits cost savings to be achieved in the areas of both labor and materials. Reliability is further enhanced since the number of parts is reduced. While the preferred embodiment employs an injection molding process, it will be clear to those skilled in the art that alternative means of production, albeit less cost effective, include cold forming a living hinge in addition to machining. Such an approach is also considered to be within the scope and spirit of the present invention.

In many applications, polypropylene alone does not possess sufficient thermal characteristics to permit its use as a rigid circuit board material. Circuit boards must withstand not only the heat encountered during use, but also the heat associated with production which usually involves wave soldering. Polypropylene has a modulus of elasticity which decreases rapidly with increasing temperatures and a flame retardant characteristic, rated at UL94 Class HB, which renders it unsuitable for use where a high flame retardancy is required. Furthermore, copper plated upon polypropylene by itself has a low peel strength of about 4 to 5 lbs/in. Circuits boards generally require peel strengths of 8 lbs/in although some applications may lend themselves to lower peel strength boards. In the above embodiments of the present invention, the polypropylene contains fillers added to improve both the flame retardant characteristics and the peel strength of plated copper forming the conductors. Suitable fillers include calcium carbonate, glass, and talc. Embodiments of the present invention are formed from polypropylene having varying concentrations and combinations of the above fillers. Examples of mixtures employed and the resulting peel strengths are set forth below in Table 1.

TABLE 1

|  | Mixture 1 | Mixture 2 | Mixture 3 | Mixture 4 |
|---|---|---|---|---|
| Glass | — | 20-30% | 15% | — |
| Calcium Carbonate | 30-40% | — | — | — |
| Talc | — | — | 20% | 40% |
| Peel Strength (lbs/in) | 20 | 12-13 | 12-13 | 4-5 |

Each of the above mixtures has a sufficient peel strength for circuit board applications. Additionally, the mixtures have an improved flame retardancy, increasing the spectrum of suitable applications. Normally, conventional living hinges are formed from polypropylene alone and have hinge lives of up to 3 million or more flexes. While the addition of fillers in the above mixtures reduces the hinge life due to added fatigue from the fillers, the life of the hinge is nonetheless more than sufficient for most circuit board applications. Typically, the hinge need only be flexed once, or at most a few times during the manufacture of the circuit board and after that only during maintenance or repair. A further advantage derived from the incorporation of fillers is that creep over time is reduced or eliminated.

Peel strength is further increased by pre-treatment prior to etching during the plating process. An electroless plating process is used that is known and is described in literature published by General Electric Corporation pertaining to plating of "ULTEM 2312", a plastic produced by General Electric Corporation. Similar plating processes, known by those skilled in the art, may also be utilized. However, the process of plating is modified by the addition of a step consisting of treating the molded polypropylene composition with an organic solvent, such as turpentine, prior to etching. The polypropylene composition is more readily attacked during the etching process due to organic solvent leached into the material. A more uniform porosity is achieved which results in increased peel strength due to enhanced mechanical bonding. Other polymers suited for use in living hinges, such as polyethylene and nylon, may be similarly employed in the practice of the invention.

It is realized that the above proportions of materials are variable over ranges wherein the amount of filler is from 50% to 200% of the amounts required by the proportions in table 1. For, example, the percentage of talc in mixture 4 may range from 10% to 50%. The proportions in table 1 are however examples of preferred proportions for use in the present invention.

The heat deflection temperatures of the above material mixtures are in the range of 250° F. to 320° F. These temperatures are below those of materials conventionally used in circuit boards. Conventional solder has a 63/37% tin/lead composition and a melting point of 361° F. Therefore, production of a completed populated circuit board of the present invention requires that low temperature solders be used in assembly. Low temperature solder composed of 58% bismuth and 42% tin has a eutectic temperature of 281° and is suitable for use in the present invention. Furthermore, the bismuth/tin solder does not contain lead. This is an advantageous characteristic because there is a current trend in industry to eliminate lead from products due to its toxic qualities and environmental concerns. Alternatively, a low temperature indium solder may be used. Another method of forming low temperature electrical connections employs conductive epoxy. Other low temperature connecting methods may be realized and are considered to be within the spirit of the present invention.

Referring to FIG. 5, a side view of an embodiment the invention is shown without the backstop plate 26 wherein living hinge 16 has a thickness T between 0.012" and 0.020". The thickness T is chosen based upon a desired stiffness of the living hinge 16 and stress considerations concerning the conductors 20. Typically, living hinges have bending radii of 0.030" or less, however, the living hinge 16 of the present invention is designed with a bending radius $R_b$ selected to limit strain on the conductors 20. One embodiment of the invention has the conductors 20 formed of 1 oz. copper plated upon the circuit board 12. It has been found that the conductors 20 will not fracture if the strain upon them is kept below 10%. Thus, in this embodiment, acceptable characteristics exist where the thickness T is 0.020" and the bending radius $R_b$ is 0.080" or more. From these parameters and a desired angle of rotation, a width of the living hinge 16 from the contact member 14 to the circuit board 12 is determined. The thickness T and width are chosen to limit the strain to below 10% for a required angular range of folding. Furthermore, it is clear that the backstop plate 26, as disclosed above, functions to limit stress upon the conductors in conjunction with the proper design of the living hinge 16. In alternative embodiments without the backstop plate 26, means external to the circuit board 12 are optionally used to limit a range of motion of contact member 14.

Additionally, thicknesses of the circuit board 12 and the support 28 may be chosen to limit the range of motion. The above dimensions are presented as examples, not limitations, and those skilled in the art will recognize that the dimensions and ranges may be varied based upon desired hinge life, conductor material and thickness, and characteristics of the polypropylene composition employed. Such variations are viewed as being within the scope of the present invention.

The present invention provides an advantage in that a three dimensional circuit is effected while employing conventional photo-etching techniques. A three dimensional photo-etching process is described in the aforementioned U.S. Pat. No. 4,985,116. The process requires that a three dimensional mask, which is formed using a YAG laser, be held on a three dimensional surface to be exposed. The three dimensional mask is held in place by a vacuum during exposure. Using this process it is possible to mold a three dimensional plated connector into a circuit board. A recess is formed wherein conductors are plated upon inner walls thereof. The three dimensional plated connector mates with a male plug which is inserted into the recess and has spring contacts pressed into connection with the conductors of the three dimensional plated connector. While the three dimensional plating process is effective for forming such connectors, the process is costlier than techniques used on conventional flat circuit boards. The present invention presents a flat surface for imaging and allows a three dimensional printed circuit configuration to be achieve by a subsequent folding of the flat surface. In the alternative, the present invention is used in conjunction with the three dimensional imaging technique. Such use allows three dimensional features to be implemented while minimizing the requirement to plate features which present difficulties, such a deep recess of a connector.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A molded electrical interconnection device for interfacing with a mating electrical connector comprising:
    a circuit board having an aperture;
    a contact member within said aperture;
    a living hinge connecting said circuit board and said contact member along linear edges of said aperture and said contact member;
    said living hinge, said circuit board and said contact member being integrally formed from a polymeric material;
    said contact member, said living hinge, and said circuit board having conductor traces on surfaces thereof;
    said conductor traces forming contacts on a surface of said contact member and electrically connecting said contacts to the conductor traces on said circuit board; and
    said contact member being rotatable on said living hinge so that said aperture can accept said mating electrical connector.

2. The molded electrical interconnection device, according to claim 1, wherein said polymeric material includes a flame retardant filler.

3. The molded electrical interconnection device, according to claim 2, wherein said flame retardant filler is selected from a group consisting of glass, calcium carbonate, and talc.

4. The molded electrical interconnection device, according to claim 3, wherein said polymeric material is selected from a group consisting of polypropylene, polyethylene, and nylon.

5. The molded electrical interconnection device, according to claim 4, wherein said conductor traces are plated upon said living hinge.

6. The molded electrical interconnection device, according to claim 5, wherein said living hinge, said circuit board, and said contact member are pre-treated with an organic solvent prior to plating.

7. The molded electrical interconnection device, according to claim 1, wherein said polymeric material is selected from a group consisting of polypropylene, polyethylene, and nylon.

8. The molded electrical interconnection device, according to claim 7, wherein said conductor traces are plated upon said living hinge.

9. The molded electrical interconnection device, according to claim 8, wherein said living hinge, said circuit board, and said contact member are pre-treated with an organic solvent prior to plating.

10. The molded electrical interconnection device, according to claim 1, wherein said conductor traces are plated upon said living hinge.

11. The molded electrical interconnection device, according to claim 10, wherein said living hinge, said circuit board, and said contact member are pre-treated with an organic solvent prior to plating.

12. The molded electrical interconnection device, according to claim 1, further comprising means for restricting a range of movement of said contact member with respect to said circuit board.

13. The molded electrical interconnection device, according to claim 12, wherein said means for restricting includes a backstop member extending from a lower surface of said circuit board, adjacent to said living hinge, such that a range of movement of said contact member is limited by contact with said backstop member.

14. The molded electrical interconnection device, according to claim 13, wherein said means for restricting further includes a support member extending from a lower surface of said contact member such that said support engages said backstop member limiting movement of said contact member at a predetermined angle with respect to said circuit board.

15. The molded electrical interconnection device, according to claim 14, wherein said support member is segmented.

16. The molded electrical interconnection device, according to claim 12, wherein said means for restricting includes a support member extending from a lower surface of said contact member such that said support member engages a lower surface of said circuit board limiting movement of said contact member at a predetermined angle with respect to said circuit board.

17. The molded electrical interconnection device, according to claim 1, comprising said living hinge having a thickness, a width between said circuit board and said contact member, and a bending radius such that a strain on said conductors is limited to a predetermined value.

18. The molded electrical connection device, according to claim 17 wherein said predetermined value is no more than 10%.

19. A molded connector structure, having a conductor carrying living hinge formed of a polymeric material, comprising:
said polymeric material including a proportion of filler material;
said proportion being effective to provide a temperature stability at a soldering temperature.

20. A molded connector structure, according to claim 19 wherein said filler material is calcium carbonate.

21. A molded connector structure, according to claim 20 wherein said soldering temperature is in the range of 250° F. to 320° F.

22. A molded connector structure, according to claim 21 wherein;
said polymeric material is selected from a group consisting of polypropylene, polyethylene, and nylon; and
said proportion is in the range of 30%–40%.

23. A molded connector structure, according to claim 19 wherein said filler material is glass.

24. A molded connector structure, according to claim 23 wherein said soldering temperature is in the range of 250° F. to 320° F.

25. A molded connector structure, according to claim 24 wherein;
said polymeric material is selected from a group consisting of polypropylene, polyethylene, and nylon; and
said proportion is in the range of 20%–30%.

26. A molded connector structure, according to claim 19 wherein said filler material includes glass and talc.

27. A molded connector structure, according to claim 26 wherein said soldering temperature is in the range of 250° F. to 320° F.

28. A molded connector structure, according to claim 27 wherein;
said polymeric material is selected from a group consisting of polypropylene, polyethylene, and nylon;
said proportion includes a proportion in the range of 15% glass and talc.

29. A molded connector structure, according to claim 19 wherein said filler material includes talc.

30. A molded connector structure, according to claim 29 wherein said soldering temperature is in the range of 250° F. to 320° F.

31. A molded connector structure, according to claim 30 wherein;
said polymeric material is selected from a group consisting of polypropylene, polyethylene, and nylon;
said proportion is in the range of 40% talc.

* * * * *